(12) United States Patent  
Pendse

(10) Patent No.: US 8,193,035 B2  
(45) Date of Patent: *Jun. 5, 2012

(54) FUSIBLE I/O INTERCONNECTION SYSTEMS AND METHODS FOR FLIP-CHIP PACKAGING INVOLVING SUBSTRATE-MOUNTED STUD BUMPS

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 36 days.

This patent is subject to a terminal disclaimer.

(21) Appl. No.: 12/731,354

(22) Filed: Mar. 25, 2010

(65) Prior Publication Data

US 2010/0178735 A1    Jul. 15, 2010

Related U.S. Application Data

(63) Continuation of application No. 11/525,493, filed on Sep. 22, 2006, now Pat. No. 7,713,782.

(51) Int. Cl.  
*H01L 21/28* (2006.01)

(52) U.S. Cl. ............................ 438/108; 257/E21.519

(58) Field of Classification Search ............ 438/108; 257/E21.519  
See application file for complete search history.

(56) References Cited

U.S. PATENT DOCUMENTS

| | | | |
|---|---|---|---|
| 5,378,859 A | 1/1995 | Shirasaki et al. | |
| 5,386,624 A | 2/1995 | George et al. | |
| 5,434,410 A | 7/1995 | Kulwicki | |
| 5,508,561 A | 4/1996 | Tago et al. | |
| 5,519,580 A | 5/1996 | Natarajan et al. | |
| 5,650,595 A | 7/1997 | Bentlage et al. | |
| 5,710,071 A | 1/1998 | Beddingfield et al. | |
| 5,844,782 A | 12/1998 | Fukasawa | |
| 5,869,886 A | 2/1999 | Tokuno | |
| 5,872,399 A | 2/1999 | Lee | |

(Continued)

FOREIGN PATENT DOCUMENTS

JP    04-355933    9/1992

(Continued)

OTHER PUBLICATIONS

Riley, George A., "Introduction to Flip Chip: What, Why, How," posted Oct. 2000, Tutorial 1—Oct. 2000, http://www.flipchips.com/tutorial01.html.

(Continued)

*Primary Examiner* — Wensing Kuo  
(74) *Attorney, Agent, or Firm* — Robert D. Atkins; Patent Law Group: Atkins & Associates, P.C.

(57) ABSTRACT

A semiconductor device is made by providing a semiconductor die having bond pads formed on a surface of the semiconductor die, forming a UBM over the bond pads of the semiconductor die, forming a fusible layer over the UBM, providing a substrate having bond pads formed on a surface of the substrate, and forming a plurality of stud bumps containing non-fusible material over the bond pads on the substrate. Each stud bump includes a wire having a first end attached to the bond pad of the substrate and second end of uniform height. The method further includes electrically connecting the second end of the wire for each stud bump to the bond pads of the semiconductor die by reflowing the fusible layer or applying thermal compression bonding, depositing an underfill material between the semiconductor die and substrate, and depositing an encapsulant over the semiconductor die and substrate.

25 Claims, 4 Drawing Sheets

U.S. PATENT DOCUMENTS

| | | | |
|---|---|---|---|
| 5,889,326 A | 3/1999 | Tanaka | |
| 5,915,169 A | 6/1999 | Heo | |
| 5,985,456 A | 11/1999 | Zhou et al. | |
| 6,153,940 A | 11/2000 | Zakel et al. | |
| 6,177,730 B1 | 1/2001 | Kira et al. | |
| 6,201,305 B1 | 3/2001 | Darveaux et al. | |
| 6,214,642 B1 * | 4/2001 | Chen et al. | 438/108 |
| 6,218,630 B1 | 4/2001 | Takigami | |
| 6,228,466 B1 | 5/2001 | Tsukada et al. | |
| 6,259,163 B1 | 7/2001 | Ohuchi et al. | |
| 6,281,450 B1 | 8/2001 | Urasaki et al. | |
| 6,297,560 B1 | 10/2001 | Capote et al. | |
| 6,324,754 B1 | 12/2001 | DiStefano et al. | |
| 6,329,605 B1 | 12/2001 | Beroz et al. | |
| 6,335,568 B1 | 1/2002 | Yuzawa et al. | |
| 6,335,571 B1 | 1/2002 | Capote et al. | |
| 6,396,707 B1 | 5/2002 | Huang et al. | |
| 6,441,316 B1 | 8/2002 | Kusui | |
| 6,448,665 B1 | 9/2002 | Nakasawa et al. | |
| 6,573,610 B1 | 6/2003 | Tsai | |
| 6,600,234 B2 | 7/2003 | Kuwabara et al. | |
| 6,608,388 B2 | 8/2003 | Lin et al. | |
| 6,710,458 B2 | 3/2004 | Seko | |
| 6,732,912 B2 * | 5/2004 | Tong et al. | 228/246 |
| 6,734,557 B2 | 5/2004 | Taniguchi et al. | |
| 6,774,497 B1 | 8/2004 | Qi et al. | |
| 6,780,673 B2 | 8/2004 | Venkateswaran | |
| 6,780,746 B2 | 8/2004 | Kinsman et al. | |
| 6,787,918 B1 | 9/2004 | Tsai et al. | |
| 6,809,262 B1 | 10/2004 | Hsu | |
| 6,818,545 B2 | 11/2004 | Lee et al. | |
| 6,849,944 B2 | 2/2005 | Murtuza et al. | |
| 6,864,168 B2 | 3/2005 | Chen et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 7,005,585 B2 | 2/2006 | Ishizaki | |
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 | 8/2006 | Kim et al. | |
| 7,102,239 B2 | 9/2006 | Pu et al. | |
| 7,173,828 B2 | 2/2007 | Lin et al. | |
| 7,208,834 B2 | 4/2007 | Lee et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,929 B2 | 11/2007 | Miyazaki | |
| 7,317,245 B1 | 1/2008 | Lee et al. | |
| 7,432,188 B2 | 10/2008 | Tsai et al. | |
| 7,436,063 B2 | 10/2008 | Miyata et al. | |
| 7,462,942 B2 | 12/2008 | Tan et al. | |
| 7,847,417 B2 | 12/2010 | Araki et al. | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 2001/0026959 A1 * | 10/2001 | Jimarez et al. | 438/126 |
| 2003/0001286 A1 | 1/2003 | Kajiwara et al. | |
| 2004/0056341 A1 | 3/2004 | Endo et al. | |
| 2004/0126927 A1 | 7/2004 | Lin et al. | |
| 2004/0169286 A1 | 9/2004 | Shibata | |
| 2004/0178481 A1 * | 9/2004 | Joshi et al. | 257/678 |
| 2004/0232562 A1 | 11/2004 | Hortaleza et al. | |
| 2005/0070085 A1 | 3/2005 | Huang et al. | |
| 2005/0103516 A1 | 5/2005 | Kaneyuki | |
| 2005/0176233 A1 | 8/2005 | Joshi et al. | |
| 2005/0224972 A1 | 10/2005 | Domon et al. | |
| 2005/0248037 A1 | 11/2005 | Hung et al. | |
| 2006/0131758 A1 | 6/2006 | Dao | |
| 2008/0093749 A1 | 4/2008 | Gerber et al. | |
| 2008/0253085 A1 | 10/2008 | Soffer | |

FOREIGN PATENT DOCUMENTS

| | | |
|---|---|---|
| JP | 10-256307 | 9/1998 |
| JP | 2000-031204 | 1/2000 |
| JP | 2004-221205 | 5/2004 |

OTHER PUBLICATIONS

"Solder Bump Flip Chip," Tutorial 2—Nov. 2000, http://www.flipchips.com/tutorial2a.html.

Riley, George A., "Stud Bump Flip Chip," Tutorial 3—Dec. 2000, http://www.flipchips.com/tutorial03.html.

Riley, George A., "Tutorial 11. Under Bump Metallization (UBM)," Tutorial 11—Sep. 2001, http://www.flipchips.com/tutorial11.html.

Riley, George A., "Gold Stud Bump Applications," Tutorial 24—Nov. 2002, http://www.flipchips.com/tutorial24.html.

FlipChip International, "Bumping Design Guide," Rev. Aug. 2005, http://www.flipchip.com.

Yamada, Hiroshi et al., "Advanced copper column based solder bump for flip-chip interconnection", International Symposium on Microelectronics, 1997, pp. 417-422, The British Library—"The world's knowledge".

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

FUSIBLE I/O INTERCONNECTION SYSTEMS AND METHODS FOR FLIP-CHIP PACKAGING INVOLVING SUBSTRATE-MOUNTED STUD BUMPS

CLAIM TO DOMESTIC PRIORITY

The present application is a continuation of U.S. patent application Ser. No. 11/525,493, filed Sep. 22, 2006, and claims priority to this application pursuant to 35 U.S.C. §120.

FIELD OF THE INVENTION

This disclosure is directed to fabrication methods for making semiconductor integrated circuits and other micro-electronic devices.

BACKGROUND OF THE INVENTION

Chip packaging is normally the final process in the long chain of processes for manufacturing semiconductor integrated circuits. Chip packaging is a multi-disciplinary technology that typically involves many steps. The technology is critically important because it has a direct impact on chip performance and reliability as well as the performance and reliability of electronic devices in which the chips are incorporated. "Packaging" as used herein encompasses any of various conventional techniques of preparing a chip (also called a "die") for actual use in an electronic device. In many instances, packaging involves, basically, encapsulating the die in a manner that seals and protects the die from the external environment and provides the required external electrical connections (called "I/O" connections) from the die to other circuitry. Packaging also can facilitate the conduction of heat away from the die during use. Other types of packaging may simply involve mounting the die on a substrate or carrier, with which the die makes the required I/O connections, without forming a discrete capsule around the individual die beforehand. Since die encapsulation consumes space, this latter packaging method is typically used in applications in which size is critical, such as electronic watches, hearing aids and other medical devices, cellular phones and other personal communication equipment, and high-speed microprocessors.

The current disclosure is directed in general to the making of electrical connections of I/O bond-pads on a die to corresponding I/O bond-pads on a substrate, carrier, lead-frame, or the like. These electrical connections provide the required I/O connections of the die to the world outside the die.

Wire bonding has, for many years, been a "workhorse" technology for making electrical connections between the I/O bond-pads on the die and the I/O bond-pads on the package or other die-mounting substrate. However, wire bonding has several disadvantages. First, it typically is performed serially, pad-by-pad, which is inherently slow and thus decreases throughput. Second, as the number of I/O connections to an integrated circuit (e.g., memory or microprocessor chip) has increased, increasingly larger numbers of I/O bond-pads on the die are required. Providing a larger number of such pads without excessively increasing the size of the chip usually requires a corresponding decrease in the pitch (i.e., a finer pitch) of I/O bond-pads on the die, wherein "pitch" is the center-to-center distance between adjacent bond-pads, and a "finer" pitch is a decreased center-to-center distance. These factors, as well as other factors, have increased the difficulty and decreased the reliability of using wire bonds, which has led to much interest in alternative methods of making I/O connections to individual dies.

Key alternative methods are derived from the so-called "flip-chip" technology. Flip-chip involves the assembly of a die to a substrate or carrier in a face-down manner by using electrically conductive bumps formed on the I/O bond-pads of the die. ("Face-down" means that the die surface on which the circuit layers are formed actually faces the substrate to which the die is attached. Wire-bonding, in contrast, is performed on face-up dies). Flip-chip methods made their debut in the mid-1960s but did not achieve widespread utilization for many years largely because wire-bonding was the norm. With the advent of extremely complex integrated circuits requiring large numbers of I/O connections, flip-chip methods became attractive because, for example: (a) they can be performed more reliably with a finer bond-pad pitch than wire-bonding; (b) they can be performed at lower cost than wire-bonding; (c) all the I/O connections to a die can be formed simultaneously rather than serially as in wire bonding; and (d) the reliability of devices formed using flip-chip methods has been proven. Currently, flip-chip components are predominantly semiconductor devices such as integrated circuits, memories, and microprocessors; however, flip-chip methods are also being used increasingly with other types of devices as well, such as passive filters, detector arrays, and MEMs devices. Flip-chip is also termed "direct chip attach" (abbreviated DCA), which is perhaps a more descriptive term because the die is attached directly to the substrate, carrier, or the like by the conductive bumps. DCA has allowed, in certain instances, elimination of a conventional "package" entirely.

Among the various conventional flip-chip methods, the most common technique is the "solder-bump" technique that forms a small, individual solder "bump" (typically a roughly spherical bump) on each of the I/O bond-pads of the die. Certain aspects of this structure are shown in FIGS. 4(A)-4(B), depicting a die 10, a substrate 12, I/O bond-pads 14 on the substrate, and I/O bond-pads 16 on the die. The solder-bump technique usually commences, before the wafer (containing multiple dies) is diced, with formation of "under-bump metallization" ("UBM") 18 on the I/O bond-pads 16 of the dies 10. Forming the UBM 18 follows removal of an insulating aluminum oxide layer on the I/O bond-pads 16 to expose elemental aluminum, and includes formation of a series of metal layers on defined regions of the exposed aluminum. Thus, the UBM 18 defines and limits the respective regions on the bond-pads to be wetted by solder in a subsequent step. Solder is deposited on the UBM regions 18 by evaporation, electroplating, screen-printing of solder paste, or needle-deposition, for example. After deposition of the solder, the wafer is heated to re-flow the solder into individual solder "balls" 20 having roughly spherical shape (FIG. 4(A)). The wafer is then diced into "bumped dies" 22. Individual bumped dies 22 are placed accurately on respective substrates 12 or carriers (generally termed "substrates"), as shown in FIG. 4(A). Each such assembly is heated to form the solder connections 24 between the die 10 and the I/O bond-pads 14 on the substrate, as shown in FIG. 4(B). After the die 10 is soldered, "underfill" (not shown, but usually an epoxy adhesive) typically is added between the die 10 and the substrate 12.

Despite certain advantages of the UBM-solder bump technology summarized above, it has certain limitations. One limitation is posed by the minimum practical size of the individual solder balls (exemplary size of each ball being 70-100 µm high and 100-125 µm in diameter), which inherently imposes limits on the minimum size of the I/O bond-pads and thus on the achievable fineness of bump pitch. Another limitation is the need to remove the wafers from the wafer-fabrication operation in order to form the solder balls, which imposes a throughput-lowering and cost-increasing disruption in the overall chip-manufacturing process. Yet another limitation is posed by the fact that the solder used for forming the balls contains lead, which is a potential source of contamination that, if not rigorously contained, can lead to device failure.

SUMMARY OF THE INVENTION

The various shortcomings of conventional methods are addressed by methods and devices as disclosed herein.

According to a first aspect, methods are provided for electrically connecting I/O bond-pads on a chip to corresponding I/O bond-pads on a substrate. An embodiment of such a method comprises forming respective stud-bumps on the I/O bond-pads on the substrate. The chip is flipped and placed on the stud-bumps such that the I/O bond-pads on the chip are registered with the corresponding stud-bumps on the substrate. The I/O bond-pads on the chip are attached to the respective stud-bumps so as to connect the respective stud-bumps electrically to the I/O bond-pads on the chip. The method further can comprise the step, before attaching the I/O bond-pads on the chip to the respective stud-bumps, of forming under-bump metallization (UBM) on each of the I/O bond-pads on the chip.

The step of attaching the I/O bond-pads on the chip can comprise fusing the stud-bumps to the I/O bond-pads. Fusing can be achieved by heating or by other suitable method that causes the fusing material to flow, at least to a limited extent, sufficient to make the noted attachments. For fusing, the stud-bumps can be formed of a fusible material. Then, after placing the flipped chip on the stud-bumps, at least a portion of the fusible material of the stud-bumps is caused to make a connection with the corresponding I/O bond-pads. An alternative manner of fusing the stud-bumps to the I/O bond-pads comprises forming a layer of a fusible material on the I/O bond-pads on the chip. Then, after placing the flipped chip on the stud-pumps, a portion of the fusible material is caused to flow from the respective I/O bond-pads to the respective stud-bumps to form a connection between the I/O bond-pads and the respective stud-bumps. This alternative method also can further comprise forming UBM on the I/O bond-pads on the chip, wherein the layer of fusible material is formed on the UBM on the I/O bond-pads on the chip.

The stud-bumps can be made using a bond-on-trace or extruded-bump technique, or other suitable technique.

Another embodiment of a method for electrically connecting I/O bond-pads on a chip to corresponding I/O bond-pads on a substrate comprises forming at least one UBM layer on each of the I/O bond-pads on the chip so as to UBM-treat each respective I/O bond-pad on the chip. A respective stud-bump is formed on each corresponding I/O bond-pad on the substrate. The chip is placed on the stud-bumps such that the I/O bond-pads on the chip are registered with the corresponding stud-bumps on the substrate. The I/O bond-pads on the chip are bonded to the respective stud-bumps on the substrate to electrically connect the respective stud-bumps to the I/O bond-pads on the chip. The step of forming at least one layer of UBM can comprise applying multiple layers of respective metals to the I/O bond-pads. For example, the at least one layer of UBM can be formed by vacuum deposition of a respective metal.

The step of bonding the I/O bond-pads on the chip to the respective stud-bumps can comprise fusing the stud-bumps to the I/O bond-pads. Fusing the stud-bumps to the I/O bond-pads can comprise forming the stud-bumps of a fusible material. After placing the chip on the stud-bumps, at least a portion of the fusible material of the stud-bumps is caused to flow to and make a connection with the corresponding I/O bond-pads. Fusing the stud-bumps to the I/O bond-pads alternatively can comprise forming a layer of a fusible material on each UBM-treated I/O bond-pad on the chip. After placing the flipped chip on the stud-pumps, a portion of the fusible material is caused to flow (e.g., by heating or other suitable technique) from the respective I/O bond-pads to the respective stud-bumps and thus form a connection between the I/O bond-pads and the respective stud-bumps. By way of example, the layer of fusible material can comprise a layer of Sn or of an alloy of Sn.

In an embodiment the stud-bumps are formed by ball-bonding respective wires to the I/O bond-pads on the substrate, followed by cutting the wires to form a stud at each ball-bond. Desirably, the stud-bumps are collectively made of substantially identical height on the substrate.

According to another aspect, chip-packaging substrates are provided. The chip-packaging substrate of one embodiment comprises a substrate having a mounting surface, on which I/O bond-pads are formed. Stud-bumps having respective first ends are attached to respective I/O bond-pads on the mounting surface. Respective second ends of the stud-bumps extend from the respective I/O bond-pads. The second ends are fusible to corresponding bond-pads on a chip intended to be mounted to the substrate and electrically connected to the I/O bond-pads on the substrate. The I/O bond-pads on the mounting surface can be extruded. The stud-bumps can be made of a wire (e.g., Au, Cu, or an alloy of one or both metals) or made of a fusible material. Particularly if the stud-bumps are made of wire, the first ends of the stud-bumps can be ball-bonded to the I/O bond-pads of the substrate.

Any of the subject methods can further comprise applying an underfill between the chip and the substrate. If desired, the chip can be encapsulated using any of various package configurations and method known in the art, for example.

Another aspect is directed to chips that are manufactured by any of the methods within the scope of the instant disclosure.

Yet another aspect is directed to microdevices, such as integrated circuits, displays, memory devices, etc. An embodiment of such a microdevice comprises a chip that defines at least one microcircuit and that comprises multiple I/O bond-pads. The microdevice also includes a substrate that defines multiple I/O bond-pads corresponding to the I/O bond-pads of the chip. A respective stud-bump is on each of the I/O bond-pads of the substrate, wherein each stud-bump is attached to the respective I/O bond-pad on the chip. The "substrate" can be, for example, a respective portion of a package for the chip, or any of various structures to which the chip is mounted to provide a durable and practical foundation for the chip and to facilitate making I/O connections to the chip.

Desirably, as noted above, the chip is in a flipped configuration relative to the substrate. The microdevice further can comprise at least one layer of UBM between each unit of fusible material and the respective I/O bond-pad on the chip. The microdevice also can further comprise an underfill between the chip and the substrate.

The foregoing and additional aspects, features, and advantages of the invention will be more readily apparent from the following detailed description, which proceeds with reference to the accompanying drawings.

BRIEF DESCRIPTION OF THE DRAWINGS

FIGS. 1(A)-1(C) are schematic elevational views showing respective stages of a method, according to a first representative embodiment, of attaching a die to a substrate using stud-bumps formed on the substrate, wherein FIG. 1(A) shows a situation before attachment, FIG. 1(B) shows a situation at commencement of attachment, and FIG. 1(C) shows the configuration after attachment;

FIGS. 2(A)-2(B) are schematic elevational view of respective stages of a method, according to a second representative embodiment, of attaching a die to a substrate, wherein FIG. 2(A) depicts a situation before attachment, and FIG. 2(B) depicts a situation after attachment;

FIGS. 3(A)-3(B) are schematic elevational views of respective stages of a method, according to a third representative embodiment, of attaching a die to a substrate, wherein FIG. 3(A) depicts a situation before attachment, and FIG. 3(B) depicts a situation after attachment; and FIGS. 4(A)-4(B) are schematic elevational views of a conventional method of attaching a die to a substrate using solder balls and a flipped chip, wherein FIG. 4(A) depicts a situation before attachment, and FIG. 4(B) depicts a situation after attachment.

DETAILED DESCRIPTION OF THE DRAWINGS

This disclosure is set forth in the context of representative embodiments that are not intended to be limiting in any way.

The subject methods achieve desired interconnections between the I/O bond-pads on the die and corresponding I/O bond-pads on a substrate, carrier, lead-frame, or the like (all generally called a "substrate") without the need to form solder balls or bumps on the die. Consequently, (a) a substantially finer pitch of I/O connections is achieved; (b) I/O connections can be made substantially anywhere on the surface of the die (called "area-array interconnect"), including in active-circuit regions of the die, rather than only in the peripheral regions of the die, thereby providing substantially more I/O connections than achievable by perimeter I/O connections; and (c) the I/O interconnections can be made without having to use lead, thereby eliminating a potential source of contamination of the finished device. Furthermore, respective portions are more suitable for (more "friendly" to; more compatible with) the wafer-fabrication environment and to the chip-assembly environment. This yields better and more sensible separation of "fabrication" steps from downstream "assembly" steps, and lowers per-die fabrication costs, compared to conventional methods for forming I/O interconnections between die and substrate.

Figure 1A:
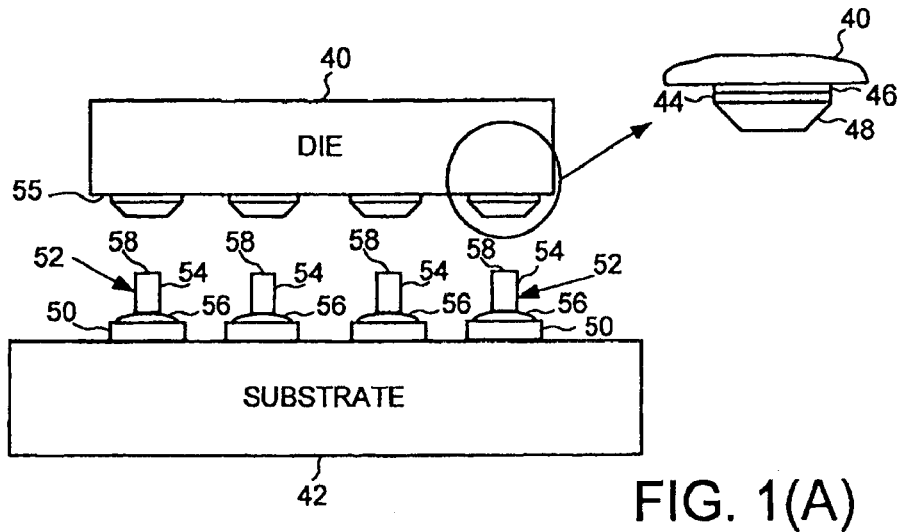
Figure 1B:
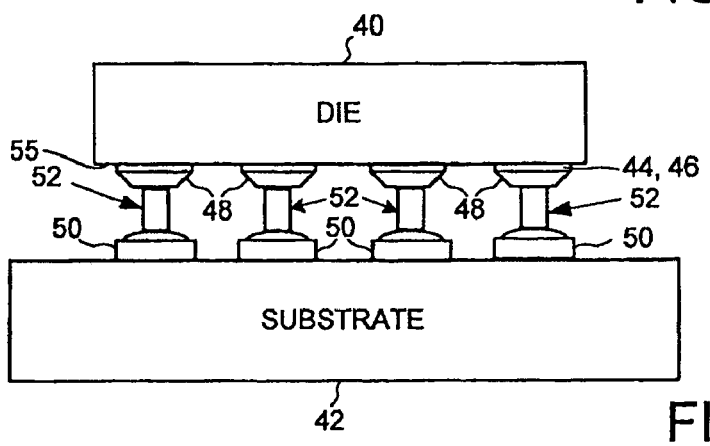
Figure 1C:
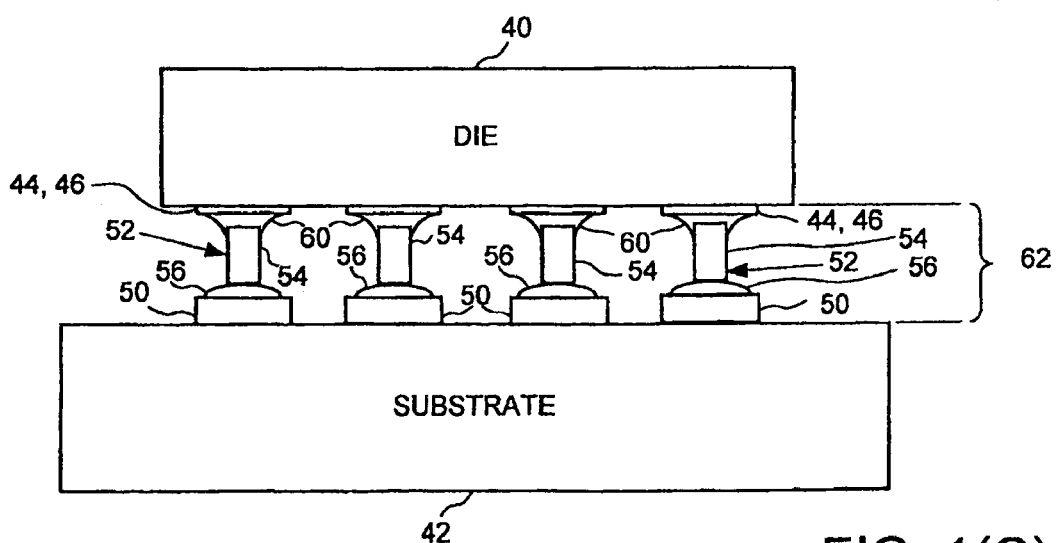

In a first representative embodiment of the subject methods, as shown in FIGS. 1(A)-1(C), under-bump metallization (UBM) 44 is formed on the I/O bond-pads 46 of the die 40 and a "thin" (relative to the thickness of a solder ball) fusible layer 48 is formed on the UBM 44. On the corresponding I/O bond-pads 50 on the substrate 42, "stud-bumps" 52 (described later below) are formed. The die 40 is "flipped" so that the face 55 of the die is toward the substrate 42. The die 40 is placed, with accurate registration, on the stud-bumps 52 such that the locations containing the fusible layer 48 contact their respective stud-bumps. The resulting assembly is treated to cause the fusible layer 48 to flow onto and complete the connections to the respective stud-bumps 52.

With respect to forming the UBM 44, it is first noted that the final metal layer of I/O bond-pads 46 on most dies is aluminum, which readily forms a sacrificial layer of aluminum oxide upon exposure to air. Aluminum oxide is an electrical insulator and should be removed before applying the UBM 44. Removal of the aluminum oxide and formation of the UBM 44 and fusible layer 48 desirably are performed in the wafer-fabrication facility before dicing the wafer. The aluminum oxide can be removed by any of various techniques such as sputter etching, plasma etching, ion etching, or by wet etching.

The UBM 44 serves to provide, inter alia, an electrically more conductive surface for the I/O bond-pads 46 of the die 40. Desirable properties of the UBM 44 are: (a) provide a strong, stable, and low-resistance electrical connection to the underlying I/O bond-pad 46 on the die, (b) adhere well to the material of the I/O bond-pad, (c) adhere to and be wettable to the layer of the fusible material 48 formed on the UBM, (d) protect the underlying I/O bond-pad 46 from the environment, and (e) provide a barrier to diffusion of harmful metals into the die 40. The UBM 44 also defines and limits the region over which the fusible layer 48 is formed. To satisfy these criteria, the UBM 44 is typically formed as multiple layers that form a gradient of material compatibility from the I/O bond-pad 46 to the layer of fusible material 48. The UBM 44 can be formed by vacuum deposition such as by evaporation or sputtering, or by chemical plating (vacuum deposition is the more common method). If the I/O bond-pads 46 on the die 40 are made of aluminum, the aluminum oxide can be removed and the UBM 44 can be formed in desired regions of the wafer by first forming (e.g., by photolithography) a mask that defines the regions (on the bond-pads) to be treated. Alternatively to using a mask, the UBM 44 can be formed using an electro-less method.

The layers of the UBM 44 have different names that denote their respective functions. A first layer, termed the "adhesion layer," adheres well to the I/O bond-pad metal (e.g., aluminum) and to any surrounding passivation as required, thereby providing a strong, low-stress, mechanical and electrical connection. A usual next layer, termed the "diffusion-barrier layer," limits the diffusion of elements in the thin, fusible layer into the underlying material. A usual third layer, termed the "wettable layer," provides a surface that is easily wettable by the material used to form the thin, fusible layer 48, so as to provide good bonding of the fusible layer to the underlying metal. An optional "protective layer," if used, is applied at least to certain regions of the wettable layer to protect the underlying material from oxidation.

The total thickness of the UBM desirably is in the range of 0.1 to 5 μm, and the actual obtained thickness depends at least to some extent on the particular method used for forming the layers of the UBM (plating tends to form thicker layers than thin-film methods). With respect to individual layers, an exemplary thickness range for the adhesion layer is 0.1 to 3 μm, an exemplary thickness range for the diffusion-barrier layer is 0.1 to 5 μm, and an exemplary thickness range for the wettable layer is 0.1 to 5 μm. An exemplary thickness range of the protective layer, if used, is 0.1 to 3 μm.

The layers of the UBM 44 can be formed using any of various combinations of metals, including (but not limited to) one or more of Cr, Cu, Ti, Ni, V, W, and Au, and alloys thereof. The particular metals, or combinations thereof, are selected according to the particular layer to be formed by them and according to particular aspects of the dies, as is understood in the art. Example UBM profiles include (but are not limited to): (a) Cr:Cr—Cu:Cu, (b) Ti:Ni—V, (c) Ti:Cu, (d) Ti:W:Au, (e) Ni:Au, (f) Al/Ni/Cu, (g) Al/NiV/Cu, and (h) Ti:Cu:Ni. The following is an exemplary protocol: (1) Sputter-etching to remove aluminum oxide and expose a fresh surface of aluminum on the bond-pads. (2) Deposit on the exposed aluminum a first UBM layer (e.g., 100-nm thick) of Ti/Cr/Al as an adhesion layer. (3) Deposit on the adhesion layer a second UBM layer (e.g., 80-nm thick) of Cr:Cu as a diffusion-barrier layer. (4) Deposit on the diffusion-barrier layer a third UBM layer (e.g., 300-nm thick) of Cu/Ni:V as the wettable layer. (5) Optionally deposit on the wettable layer a protective layer (e.g., 50 nm Au).

After completing formation of the UBM 44, the fusible layer 48 is formed on the UBM regions. Formation of the fusible layer 48 can be (and desirably is) performed using the same mask as used for forming the UBM. Hence, the fusible layer 48 can be formed as part of the UBM "stack" of constituent layers, thereby eliminating a separate deposition step. Alternative methods of forming the fusible layer 48 include (but are not limited to): (a) screen-printing of a paste of the fusible-layer material on UBM regions 44 of the die, and (b) plating the fusible material on the UBM regions 44. Exemplary materials for forming the fusible layer 48 include Sn; binary alloys such as Sn—Pb, Sn—Bi, Sn—Cu, Sn—Ag, and Sn—Sb; ternary alloys of any of these elements (e.g., Sn—Ag—Cu); and other suitable materials (e.g., a formulation lacking Pb is especially desirable for many applications). The regions of fusible layer 48 on the die 40 serve the same function as solder balls on conventional bumped dies, but without the need for solder balls or solder bumps on the die. An exemplary thickness range for the fusible layer 48 is 0.5 to 50 μm. The actual thickness depends, at least in part, on the particular method used for forming the fusible layer. Thermal-compression methods tend to produce a thinner layer, whereas pick-and-place methods tend to produce a thicker layer.

With respect to the substrate 42, bumps are formed at respective locations on I/O bond-pads 50 that correspond to the bond-pad locations on the die that were treated with UBM 44 and fusible material 48. The bumps on the substrate 42 desirably are configured as stud-bumps 52 or stud-pedestals and desirably are formed by conventional stud-bumping techniques used for forming stud-bumps on dies. The stud-bumps 52 desirably are formed of a non-fusible material (e.g., Cu or Au or alloys thereof). An exemplary height range for the stud-bumps 52 is 30 to 60 μm.

An example technique for forming a stud-bump 52 is a modification of the "ball-bonding" technique used in conventional wire bonding. For making the stud-bumps, the wire can be made of, for example, Au or Cu or alloys thereof. In ball-bonding, the tip of the bond wire is melted to form a small sphere. A wire-bonding tool presses the sphere against the I/O bond-pad with mechanical force, heat, and ultrasonic energy to form a metallic connection of the ball to the bond-pad. As a result, the ball is generally flattened into a disk pressed against the bond-pad. Making a stud-bump 52 begins with making a ball-bond 56 of a wire 54 to the I/O bond-pad 50 in a similar manner, followed by cutting the wire closely above the ball-bond. The resulting "stud-bump" 52 remaining on the I/O bond-pad 50 provides a permanent and reliable connection to the metal of the bond-pad. Due to the manner in which the sphere 56 is pressed against the I/O bond-pad 50, the resulting connection usually penetrates through any oxide layer that may be present on the bond-pad. An exemplary diameter range for the somewhat flattened spheres 56 at the base of the wire 54 is 30-75 μm.

In this embodiment, after forming the stud-bumps 52 on the substrate 42, the "wires" 54 thereof can be flattened ("coined") by mechanical pressure or other suitable technique. Thus, as shown in FIG. 1(A), flat top surfaces 58 are provided on the wires 54, yielding more uniform bump heights. Each stud-bump 52 can be coined individually by a tool immediately after formation of the bump, or alternatively all the stud-bumps on the substrate 42 can be coined simultaneously by applying pressure to them using a flat surface in a separate operation after forming the bumps.

Conventional stud-bumps on a die are connected to their respective I/O bond-pads on a substrate using a conductive or non-conductive adhesive. In contrast, referring for example to FIGS. 1(B) and 1(C), the stud-bumps 52 on the substrate 42 are connected to their respective I/O bond-pads 46 on the die 40 using the fusible material 48 already applied to the I/O bond-pads on the die. This can be achieved using a pick-and-place operation of the die 40 followed by a reflow step, or by a thermocompression-bonding step, to cause flow of the fusible material 48 to and around the contacting stud-bumps (see regions 60 in FIG. 1(C)), bridging between the tips of the wires 54 and the I/O bond-pads 46 with UBM 44).

The stud-bumps 52 provide a space 62 between the die 40 and the substrate 42. If desired or necessary in this and other embodiments, this under-chip space 62 can be filled with a non-conductive "underfill" adhesive (not shown, but well-understood in the art) that bonds the entire facing surface 55 of the die 40 to the substrate 42. The underfill protects the stud-bumps 52 from moisture and other environmental hazards, and provides additional mechanical strength to the assembly. Another key function of the underfill adhesive is to compensate for thermal expansion differences between the die 40 and the substrate 42. Underfill mechanically bonds together the die 40 and substrate 42 so that differences in thermal expansion do not break or damage the electrical connections formed by the stud-bumps 52.

The underfill adhesive must bond well to both the passivation layer on the surface 55 of the die 40 and to the substrate 42. To achieve such a bond, it is desirable to perform, before applying the adhesive, a cleaning step to remove any residue from the die 40 and substrate 42. Underfill can be needle-dispensed along one or two edges of the die 40 and drawn into the under-die space 62 by capillary action. The adhesive is typically heat-cured after application.

After mounting the die to the substrate as described above, in this and other embodiments the die and substrate can be encapsulated using any of various packaging methods and materials as well known in the art. Encapsulation can be, depending upon the particular die and its intended application, preceded or not preceded by application of underfill. Alternatively to encapsulation, again depending upon the die and its intended application, the die can be used "naked" (i.e., unencapsulated). The die can be subjected to other processes, as required, to render it resistant to a particular environment or condition of use.

Figure 2A:
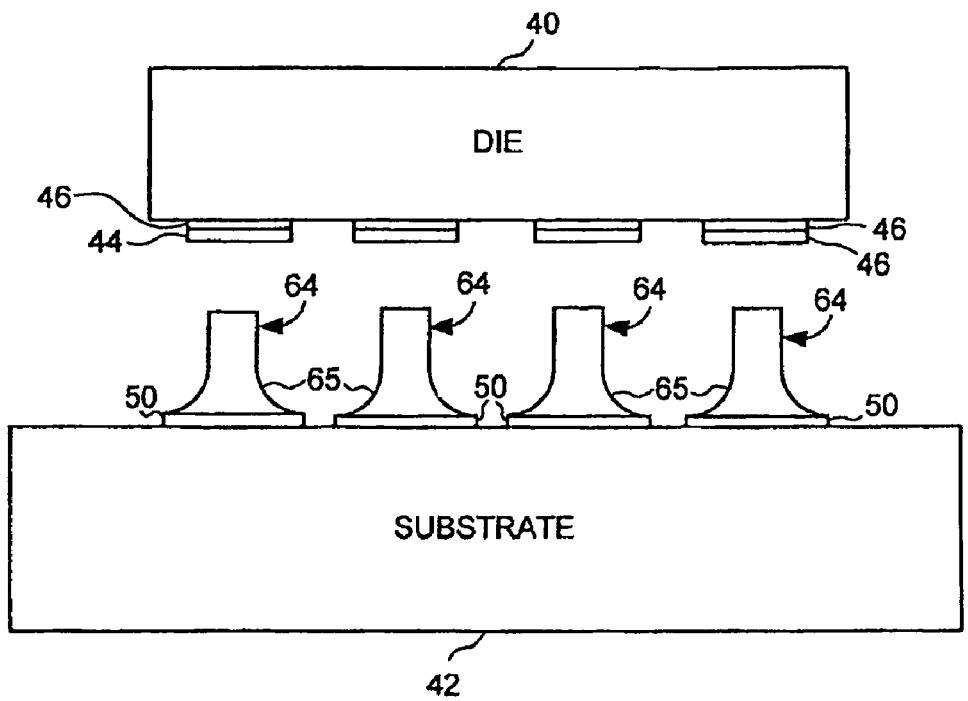
Figure 2B:
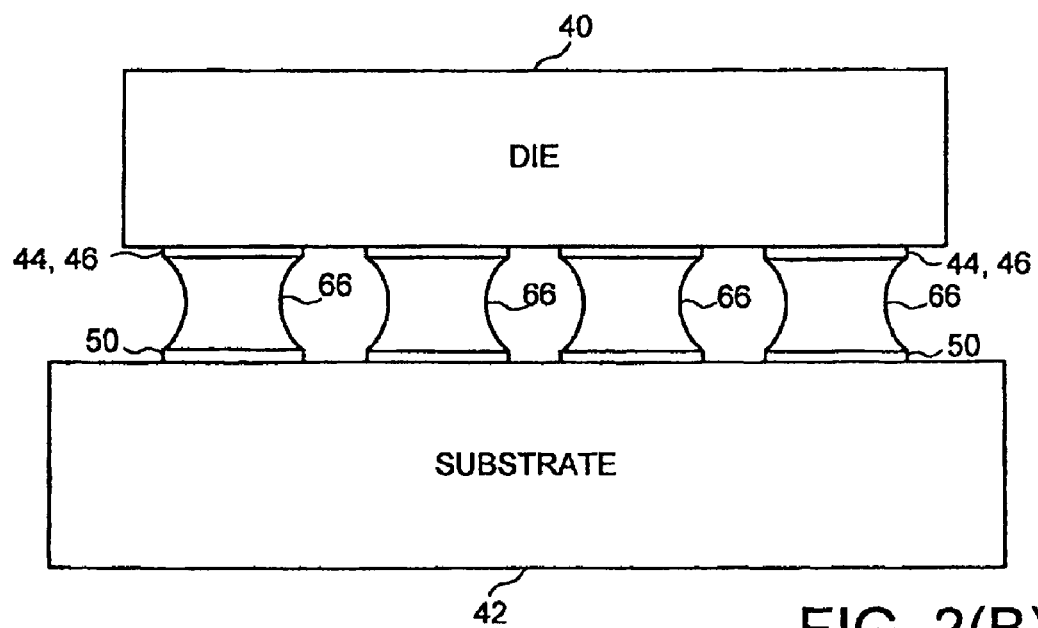

In a second representative embodiment, an alternative technique is used for forming the stud-bumps. This embodiment is illustrated in FIGS. 2(A)-2(B), which depicts the die 40, the substrate 42, the I/O bond-pads 46 on the die, UBM 44 on the bond-pads 46, and I/O bond-pads 50 on the substrate. In this alternative embodiment, stud-bumps 64 are formed on the I/O bond-pads 50 using "solder wire" made of a fusible metal or alloy thereof. As in the first representative embodiment described above, the tip of the solder wire is heated to form a small sphere or the like. The ball is pressed against the I/O bond-pad 50 with a combination of force and heat energy to form a connection 65 of the solder wire to the bond-pad. This is followed by cutting the wires closely above the resulting bonds. The resulting structure is shown in FIG. 2(A). An advantage of this alternative embodiment is that it does not require, and hence lacks, the fusible layer 48. Rather, only the UBM 44 is formed on the I/O bond-pads 46 of the die 40. This is because the stud-bumps 64 themselves are fusible to the UBM 44 on corresponding I/O bond-pads 46 of the die 40. The structure after bonding is shown in FIG. 2(B), depicting the resulting connections 66 between the die 40 and substrate 42. As a result of omitting the fusible material on the die 40, this embodiment is even more compatible with a wafer-fabrication environment than the first representative embodiment. Namely, the die can be prepared conveniently in the wafer-fabrication facility without concern of possible contamination arising from forming a fusible layer at that location, and the substrate can be prepared conveniently in the assembly-and-packaging facility. The finished die is then delivered to the assembly-and-packaging facility where it is attached to the substrate using a process that is compatible with other processes performed there.

In certain embodiments, if the I/O bond-pads on the chip do not pose material-compatibility issues with the fusible material 48, the UBM 44 can be either eliminated or at least simplified (e.g., with fewer layers than described above). In such embodiments, the fusible material 48 is applied, either with or without intervening UBM, on the I/O bond-pads of the chip.

In the first representative embodiment (FIGS. 1(A)-1(C)), for example, the stud-bumps 52 can be formed on the I/O bond-pads 50 of the substrate 42 without having to perform an oxide-removal step or a UBM-formation step. Also, the die can be prepared (by forming the UBM 44 and the fusible layer 48) while the die is still in the wafer-fabrication facility. These are substantial benefits of the subject methods because wafer-fabrication and downstream chip-assembly and -packaging steps are often perform in different factories, and because now the die and substrate can be more completely prepared in facilities in which the requisite processes are more "friendly" (i.e., more compatible with other processes performed in the facility) Specifically, the upper structure shown in FIG. 1(A) can be produced entirely in a wafer-fabrication facility in which the requisite process steps for forming the structure are better accommodated, and the lower structure shown in FIG. 1(A) can be produced in an assembly factory in which the requisite process steps are better accommodated. Then, the upper structure can be delivered to the assembly factory at which the steps shown in FIGS. 1(B) and 1(C) are conducted. Thus, the entire process flow is more streamlined, which increases throughput and lowers costs. Furthermore, because the substrate 42 is more robust than a wafer or die, concerns about collateral damage possibly arising during formation of the stud-bumps 52 on the substrate 42 are greatly alleviated compared to forming stud-bumps on the die 40.

Figure 3A:
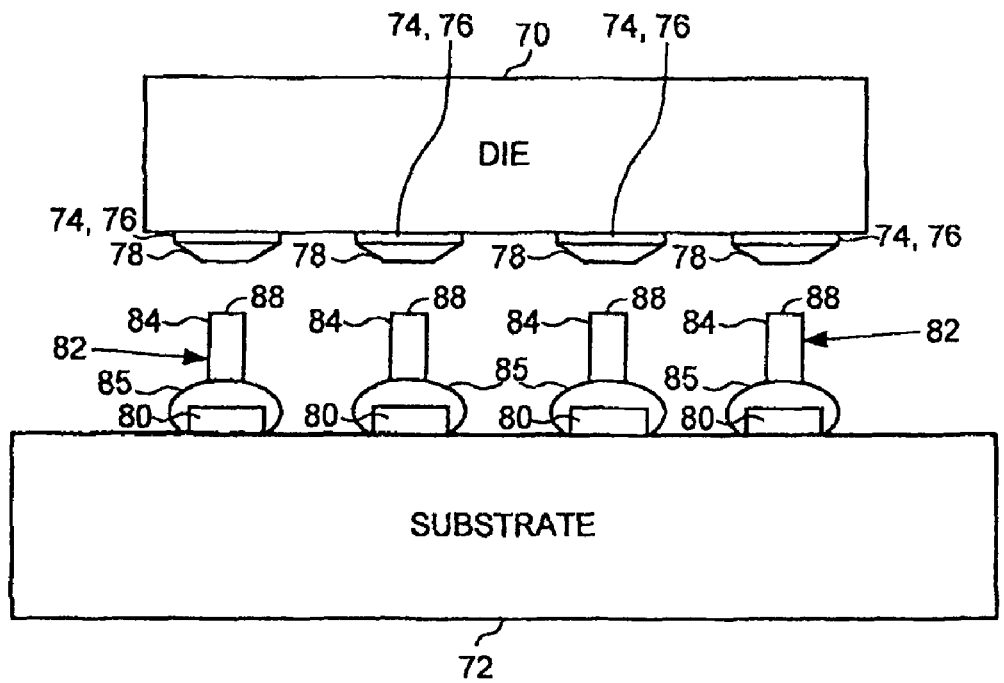
Figure 3B:
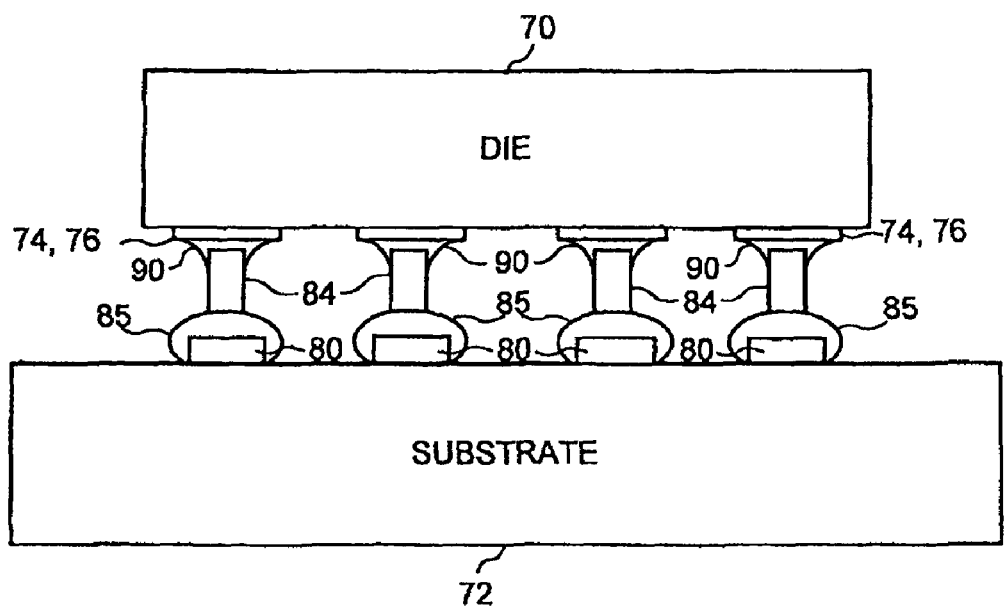
Figure 4A:
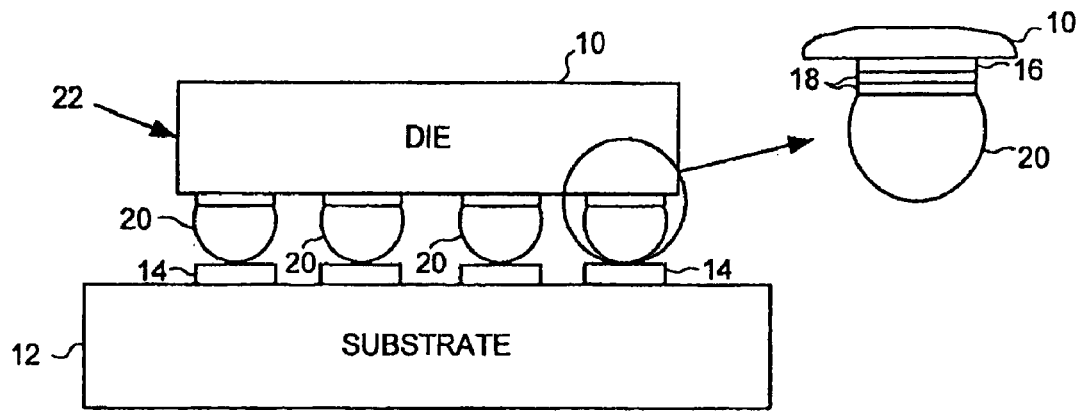
Figure 4B:
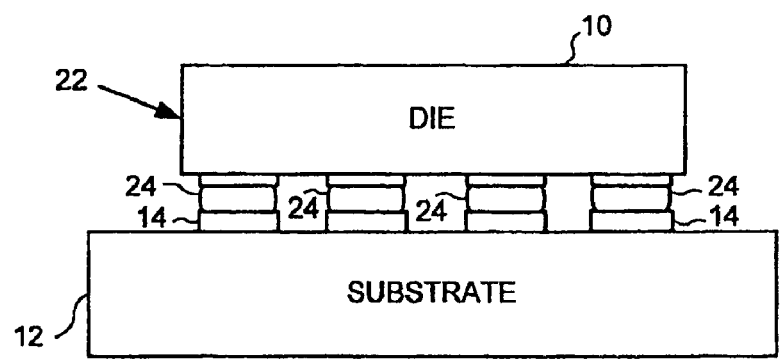

A third representative embodiment is shown in FIGS. 3(A)-3(B), in which the process is a "bond-on-trace"/"extruded bump" method. Many details shown in FIGS. 3(A)-3(B) are similar to corresponding details of the embodiment shown in FIGS. 1(A)-1 (C). Shown are the die 70 and the substrate 72. In this embodiment, UBM 74 is formed on the I/O bond-pads 76 of the die 70 and a fusible layer 78 is formed on the UBM 74. The I/O bond-pads 80 on the substrate 72 can be narrowly spaced traces and can be formed by extrusion. The stud-bumps 82 are formed on the I/O bond-pads with a portion of the base 85 actually extending over the side of the bond-pad (compare with FIGS. 1(A)-1(C)). The flipped die 70 is placed, with accurate registration, on the stud-bumps 82 such that the locations containing the fusible layer 78 contact their respective stud-bumps. The resulting assembly is treated to cause the fusible layer 78 to flow onto and complete the connections to the respective stud-bumps 82.

The methods described above have the following advantages over conventional methods: (1) The instant methods eliminate several wafer-processing steps normally associated with solder-deposition at the wafer-level, and replace these steps with thin-film deposition steps that are gentler to the wafer infrastructure in the wafer-fabrication environment. In particular, thin-film sputtering of Sn at high speeds exceeding 1 un/minute is currently feasible. (2) The instant methods eliminate the large volume of solder from I/O interconnections between the die and substrate, which allows finer interconnection pitches to be achieved. (3) With the instant methods, formation of stud-bumps on the substrate, including using a "bond-on-trace" or "extruded bump" technique, allows the stud-bumps to be formed at very fine pitch (70 μm or less, for example). (4) The instant methods allow Sn or an alloy thereof to be used for the fusible layer and Cu or Au, or respective alloys thereof, to be used for the stud-bump material, thereby providing Pb-free I/O interconnections of the die to the substrate. (5) In the instant methods, use of a solder mask on the substrate can be eliminated, thereby making the substrate less expensive and more manufacturable. (6) In the instant methods, forming stud-bumps on the substrate is easy to incorporate into other package-assembly operations with minimal investment.

Whereas the invention has been described in the context of representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. A method of making a semiconductor device, comprising:
    providing a semiconductor die having a plurality of bond pads formed on a surface of the semiconductor die;
    forming an under bump metallization (UBM) over the bond pads of the semiconductor die;
    forming a fusible layer over the UBM;
    providing a substrate having a plurality of traces formed on a surface of the substrate; forming a plurality of stud bumps containing non-fusible material over the traces on the substrate, each stud bump including a wire having a base contacting first and second side surfaces of the traces and a tip of uniform height opposite the base; and
    electrically connecting the tip of the wire to the bond pad of the semiconductor die by reflowing the fusible layer or applying thermal compression bonding such that the fusible layer contacts the tip while leaving exposed an intermediate portion of the wire between the tip and base.

2. The method of claim 1, wherein the fusible layer includes tin or tin alloy.

3. The method of claim 1, wherein forming the UBM includes:
    forming an adhesion layer over the bond pads on the semiconductor die;
    forming a barrier layer over the adhesion layer; and
    forming a wettable layer over the barrier layer.

4. The method of claim 1, further including:
    depositing an underfill material between the semiconductor die and substrate; and
    depositing an encapsulant over the semiconductor die and substrate.

5. A method of making a semiconductor device, comprising:
    providing a semiconductor die having a plurality of bond pads formed on a surface of the semiconductor die;
    forming a fusible layer over the surface of the semiconductor die; providing a substrate having a plurality of traces formed on a surface of the substrate; forming a plurality of electrical interconnects containing non-fusible material contacting first and second side surfaces of the traces on the substrate, the electrical interconnects each including a wire having a base and a tip of uniform height opposite the base; and electrically connecting the tip of the wire to the bond pad of the semiconductor die such that the fusible layer contacts the tip while leaving exposed an intermediate portion of the wire between the tip and base.

6. The method of claim 5, further including cutting and flattening the tip of the wire by mechanical pressure to the uniform height.

7. The method of claim 5, further including electrically connecting the tip of the wire to the bond pad of the semiconductor die by reflowing the fusible layer or applying thermal compression bonding.

8. The method of claim 5, wherein the fusible layer includes tin or tin alloy.

9. The method of claim 5, further including forming an under bump metallization (UBM) between the fusible layer and bond pads of the semiconductor die.

10. The method of claim 9, wherein forming the UBM includes:
forming an adhesion layer over the bond pads on the semiconductor die;
forming a barrier layer over the adhesion layer; and
forming a wettable layer over the barrier layer.

11. The method of claim 5, further including depositing an underfill material between the semiconductor die and substrate.

12. The method of claim 5, further including depositing an encapsulant over the semiconductor die and substrate.

13. A method of making a semiconductor device, comprising:
providing a semiconductor die having a plurality of bond pads formed on a surface of the semiconductor die;
forming an under bump metallization (UBM) over the bond pads of the semiconductor die;
forming a fusible layer over the UBM;
providing a substrate having a plurality of traces formed on a surface of the substrate; forming a plurality of stud bumps containing non-fusible material contacting first and second side surfaces of the traces; and
electrically connecting the stud bumps to the bond pads of the semiconductor die.

14. The method of claim 13, wherein the stud bumps each include a wire having a base formed over first and second side surfaces of the traces and a tip of uniform height opposite the base electrically connected to the bond pad of the semiconductor die.

15. The method of claim 14, further including electrically connecting the tip of the wire to the bond pad of the semiconductor die by reflowing the fusible layer or applying thermal compression bonding.

16. The method of claim 13, wherein the fusible layer includes tin or tin alloy.

17. The method of claim 13, wherein forming the UBM includes:
forming an adhesion layer over the bond pads on the semiconductor die;
forming a barrier layer over the adhesion layer; and
forming a wettable layer over the barrier layer.

18. The method of claim 13, further including depositing an underfill material between the semiconductor die and substrate.

19. The method of claim 13, further including depositing an encapsulant over the semiconductor die and substrate.

20. A method of making a semiconductor device, comprising:
providing a semiconductor die having a plurality of bond pads formed on a surface of the semiconductor die;
forming a fusible layer over the surface of the semiconductor die;
providing a substrate having a plurality of traces formed on a surface of the substrate; forming a plurality of electrical interconnects containing non-fusible material over the traces on the substrate, the electrical interconnects including a wire having a base contacting first and second side surfaces of the traces and a tip of uniform height opposite the base; and
electrically connecting the tip of the wire to the bond pad of the semiconductor die.

21. The method of claim 20, wherein the fusible layer includes tin or tin alloy.

22. The method of claim 20, further including forming an under bump metallization (UBM) between the fusible layer and bond pads of the semiconductor die.

23. The method of claim 22, wherein forming the UBM includes:
forming an adhesion layer over the bond pads on the semiconductor die;
forming a barrier layer over the adhesion layer; and
forming a wettable layer over the barrier layer.

24. The method of claim 20, further including:
depositing an underfill material between the semiconductor die and substrate; and
depositing an encapsulant over the semiconductor die and substrate.

25. The method of claim 1, further including cutting and flattening the tip of the wire by mechanical pressure to the uniform height.

* * * * *